(12) United States Patent
Chadwick et al.

(10) Patent No.: US 6,552,920 B2
(45) Date of Patent: Apr. 22, 2003

(54) SAVING CONTENT ADDRESSABLE MEMORY POWER THROUGH CONDITIONAL COMPARISONS

(75) Inventors: Thomas B. Chadwick, Essex Junction, VT (US); Tarl S. Gordon, South Burlington, VT (US); Eric Jasinski, Colchester, VT (US); Rahul Nadkarni, Colchester, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/892,396

(22) Filed: Jun. 27, 2001

(65) Prior Publication Data

US 2003/0002313 A1 Jan. 2, 2003

(51) Int. Cl.[7] ................................................. G11C 15/00
(52) U.S. Cl. ...................... 365/49; 365/189.07; 365/203
(58) Field of Search ............................... 365/49, 189.07, 365/202, 196, 189.08, 203

(56) References Cited

U.S. PATENT DOCUMENTS

| | | | | |
|---|---|---|---|---|
| 5,396,449 A | * | 3/1995 | Atallah et al. ............... 365/156 |
| 5,446,685 A | * | 8/1995 | Holst ........................... 365/154 |
| 5,574,875 A | * | 11/1996 | Stansfield et al. ........... 711/118 |
| 5,598,115 A | * | 1/1997 | Holst ........................... 326/113 |
| 5,859,791 A | * | 1/1999 | Schultz et al. ......... 365/189.05 |
| 5,978,246 A | | 11/1999 | Shindo |
| 6,114,873 A | * | 9/2000 | Sahraoui et al. ............... 326/39 |

* cited by examiner

*Primary Examiner*—David Nelms
*Assistant Examiner*—Thong Le
(74) *Attorney, Agent, or Firm*—McGinn & Gibb, PLLC; Robert A. Walsh, Esq.

(57) ABSTRACT

A method and structure for improving a content addressable memory array has a plurality of serially connected memory sub-arrays (which include at least one memory cell), a matchline connected to each of the sub-arrays, a valid memory cell, a comparator receiving input from the matchline and valid memory cell, a sinkline output from the comparator, and a precharge device. The sinkline and matchline are reset from a first voltage to a second voltage depending upon the results of a compare operation of the input data to the data in the storage device. When the second voltage appears on the matchline and the first voltage appears on the sinkline this indicates a match between the data within all of the sub-arrays and the input data.

24 Claims, 7 Drawing Sheets

SAVING CONTENT ADDRESSABLE MEMORY POWER THROUGH CONDITIONAL COMPARISONS

BACKGROUND OF THE INVENTION

1. Field of the Invention

The invention generally relates to content addressable memories and more particularly to an improved content addressable memory that includes comparator features which decrease precharging activities and, therefore, reduce power consumption.

2. Description of the Related Art

The purpose of a content addressable memory (CAM) is to conduct a large number of searches as quickly as possible. Power dissipation is typically high as speed is the primary design goal. A typical CAM uses dynamic logic to precharge a matchline to the default condition (a match), and conditionally discharge this matchline (to the mismatch condition). After the search operation is completed, the result is detected, and the matchline is precharged to the default match condition. The only time the matchline does not consume precharge power is when it is not discharged between searches (e.g., when there is a match).

It is mathematically trivial to prove that a random bit will match half of the time and mismatch half of the time. Matching 100% of the bits, therefore, becomes decreasingly uncommon as the number of bits increases. For example, the chance of a matching word becomes $0.5^n$ (where n is the number of bits in the word searched) and n is typically much greater than 8, typically between 32 and 288. Since the only time the matchline saves power is when it is not discharged between searches, it is desirable to decrease the number of times that it is discharged. With 8 bits, $0.5^n$ is 0.0039. Thus, such a conventional 8-bit word CAM dissipates all precharged power greater than 99.5% of the time, with random data. While it is important to prevent the meaningless waste of power, slowing CAM and other memory components is much less acceptable. Therefore, there is a need to conserve power in CAMs without sacrificing speed.

SUMMARY OF THE INVENTION

It is, therefore, an object of the present invention to provide a structure and method for improving a content addressable memory array having a plurality of serially connected memory sub-arrays (which include at least one memory cell), a matchline connected to each of the sub-arrays, a valid memory cell, a comparator which receives input from the matchline and valid memory cell, a sinkline output from the comparator, and a precharge device. The sinkline and matchline are reset from a first voltage to a second voltage depending upon the results of a compare operation of the input data to the data in the storage device. When the second voltage appears on the matchline and the first voltage appears on the sinkline this indicates a match between the data within all of the sub-arrays and the input data. If the second voltage appears on the sinkline this indicates a mismatch between data within any of the sub-arrays and the input data, or an invalid status within the valid memory cell and maintains the sinkline at the second voltage. If the first of the sub-arrays has data different than the input data, this maintains the sinkline at the second voltage. Further, the matchline is maintained at the second voltage while the sinkline is at the second voltage.

Within each of the sub-arrays, the memory cells are connected serially and include a dynamic transistor for communicating with adjacent memory cells. The invention may also include sense amplifiers, each connected to a different sub-array, wherein the sense amplifiers include a single inverter. Further, if the first of the sub-arrays has data matching the input data, this drops the sinkline to the first voltage. In addition, if the sinkline is at the first voltage and a second of the sub-arrays has data different than the input data, the sinkline is connected to the matchline and drops the matchline to the first voltage. In the alternative condition, if the sinkline is at the first voltage and a second of the sub-arrays has data matching, then the matchline maintains the second voltage.

Therefore, the invention indicates a non-matching memory cell array without discharging the matchline. Instead, the high voltage on the sinkline indicates a non-matching condition. As discussed in greater detail below, only a limited number of circumstances allow the matchline to discharge when indicating a non-match condition. Therefore, by reducing the instances when the matchline will discharge, the invention eliminates the need to precharge the matchline as often and therefore consumes less power than conventional content addressable memory devices that precharge the match line more than 99% of the time.

The invention reduces the number of times the matchline must be precharged by reducing the situations in which the matchline may discharge. Matchline power consumption goes up as the number of bits in a word increase. Match bitline power consumption goes up as the number of words in the array goes up. Therefore, the invention can produce even greater power savings as the sizes of the arrays and sizes of the words increase. Power is also saved by only comparing data words that have been marked as "valid" within the scope of the application. In the event that a word is marked invalid, only the first two sub-arrays compare, leaving the presumably largest subset of the data to save power.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, content addressable memories have a large power requirement because the matchline must be precharged before almost every search of the memory array. The invention reduces the number of times the matchline must be precharged by reducing the situations in which the matchline may discharge. More specifically, the invention includes a valid signal and sinkline that prevent the matchline from discharging under specific circumstances.

Figure 1:
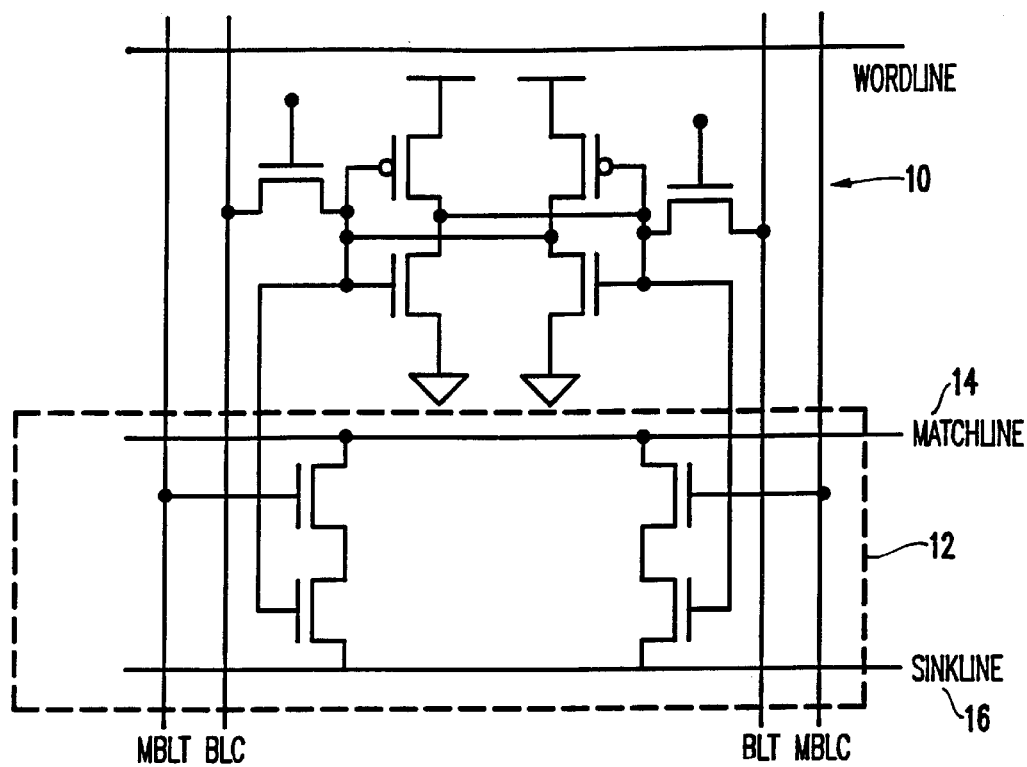
FIG. 1 is a schematic diagram of a conventional memory cell.

Referring now to FIG. 1, a content addressable memory cell is illustrated. The upper part of the memory cell is the actual storage element 10 itself and the lower part of the memory cell is a conventional comparator 12. FIG. 1 also illustrates the conventional wordline, the matching bitline true (MBLT), matching bitline complement (MBLC), bitline true (BLT), and bitline complement (BLC). The internal features of the storage elements/comparators are well known to those ordinarily skilled in the art and not discussed here so as not to unnecessarily obscure the salient features of the invention.

Conventional content addressable memory cells also include a matchline 14. As discussed above, conventional content addressable memory arrays precharge the matchline 14 before comparison data is sent to the comparator 12. If the input data matches the data within the storage element 10, the matchline 14 remains at the higher voltage precharge level. On the other hand, if the data within the storage element 10 does not match the data input, the comparator 12 lowers the voltage of the matchline 14. Since the data in the storage entry will match the inquiry data only a small number of times, the conventional content addressable memory architecture precharges and discharges almost every matchline 14 within the array each time a data inquiry is performed.

In general terms, the inventive content addressable memory array includes serially connected memory sub-arrays. There is a matchline connected to each of said sub-arrays and a comparator having inputs connected to the matchline and the valid memory bit(s). The sinkline is output from the comparator.

An initial test is performed by testing a first sub-array to determine if a second sub-array contains valid data and a search is performed to determine whether a portion of the word searched matches any portion of a word stored in the second sub-array. This test, if successful, results in the valid signal for the first sub-array and the matchline signal for the second sub-array both transitioning to a low voltage. These voltages being low as input to an OR gate comparator, drive the sinkline voltage low, which indicates the match condition in the first and second sub-arrays. An invalid status within the valid memory bit maintains the sinkline at the precharge voltage. Also, if the first of the series of said sub-arrays has data different than the input data, the sinkline is maintained at a high voltage level. Further, when the sinkline has a high voltage, there is no discharge path for the matchline, so the matchline remains high.

Therefore, the invention indicates a non-matching condition in at least one of two tested CAM sub-arrays without discharging the matchline. Instead, the high voltage on the sinkline indicates a non-matching condition. As discussed in greater detail below, only a limited number of circumstances allow the matchline to discharge when indicating a non-match condition. Therefore, by reducing the instances when the matchline will discharge, the invention eliminates the need to precharge the matchline as often and therefore consumes less power than conventional content addressable memory devices that precharge the match line more than 99% of the time.

As discussed in greater detail below, the inventive content addressable memory cell includes a sinkline 16 that is utilized to reduce the number of times the matchline 14 needs to be precharged, thereby saving power. The operation of the sinkline 16 will be explained with reference to FIG. 2, which illustrates a first CAM cell array 20, a second CAM cell array 22, a first sense amplifier 24, a third CAM cell array 26, and a second sense amplifier 28.

Figure 2:
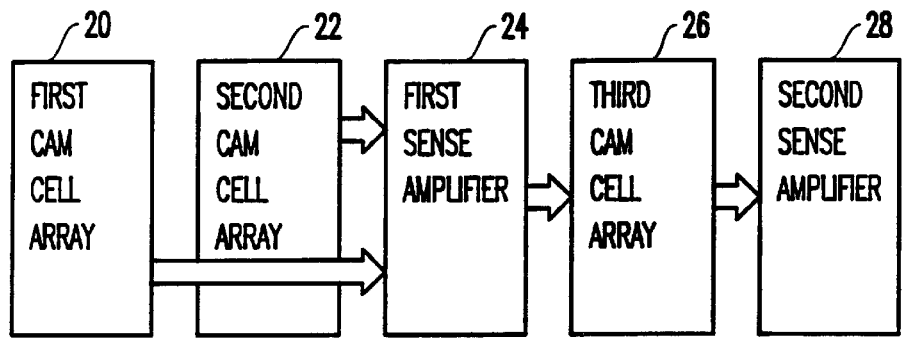
FIG. 2 is a schematic block diagram of a memory cell array.

The first CAM cell array 20 is a special cell (or cells) that includes information as to whether the data within all the cells of an array is valid data (e.g., validity cells). The second and third arrays 22, 26 are sub-arrays of the overall larger content addressable memory array and actually maintain the data stored by the array. For example, sub-array 26 is similar to the cell shown in FIG. 1. Data is arranged such that the second and third sub-arrays 22, 26 each contain a portion of each searchable word, for example, each sub-array contains a four-bit portion of an eight-bit word. While only two sub-arrays 22, 26 are illustrated in FIG. 2, as would be known by one ordinarily skilled in the art given this disclosure, many more sub-arrays can be utilized with content addressable memories. The sub-arrays 22, 26 are arranged serially and the data held within the arrays is examined sequentially. Therefore, the data within the second sub-array 22 is checked before the data within the third sub-array 26.

In one embodiment of the invention, the sinkline 16 and the matchline 14 are initially set to before the comparison data is input into the circuit. If the data within the second sub-array 22 does not match the data input as the query into the array, the sinkline 16 remains at a high voltage level. The subsequent serial sub-array 26 will recognize this high voltage level on the sinkline 16 and will not perform a comparison of the data contained within the third sub-array 26. To the contrary, if the second sub-array 22 data matches the inquiry data, the sinkline 16 is discharged to a zero or low voltage level. The third sub-array 26, upon sensing the low sinkline 16 voltage level will perform a data comparison of the input data to the data stored within the third sub-array 26. If the data also matches the third sub-array 26, the matchline 14 in the third sub-array 26 remains at a high voltage level, thereby indicating a data match. However, if the data within the third sub-array 26 does not match the query data input into the overall array, the matchline 14 is also discharged, indicating a non-match condition. Therefore, a non-match condition is indicated by a high sinkline 16 or by a low matchline 14. The only signal condition which would indicate a proper data match is a low sinkline 16 and a high matchline 14. Thus, whenever the second sub-array 22 does not have data matching the inquiry data, a high sinkline 16 is presented to the third sub-array which prevents the matchline 14 in the third sub-array from being discharged. In such a situation, the matchline 14 in the third sub-array and sinkline 16 in the third array are not discharged. Since these lines are not discharged, they do not need to be precharged before the next data comparison is performed. By eliminating the number of situations where the matchline 14 needs to be precharged, substantial power savings are achieved with the use of the sinkline 16.

As shown in FIG. 2, CAMs typically have "valid" bits 20 set aside which are used to remove an entire word (e.g., a group of sub-arrays) from the searchable state. Those skilled in the art are familiar with how valid bits are used; the term "valid bit" refers to a status bit, of which there can be more than one, which can indicate age, validity, or a number of other states of the data within the associated sub-arrays. In a preferred embodiment, the invention conducts a search on a predetermined subset of the data and only continues the search for the rest of the array if that subset matches and the word is determined to be "valid". More specifically, the invention simultaneously begins a search in the first section 20 (valid bit(s)) and the second section 22 (which contains a subset of actual data). The successful result of the two parallel comparisons conditionally enable a search of the third section 26 by bringing low the sinkline (providing a ground wire to discharge the third array's matchline).

In the first example shown in FIG. 2, there may be one valid bit per word (where an 8-bit word may stored in two 4-bit sub-arrays) as the first CAM cell array 20, and four bits per word in the second CAM cell array 22. However, as would be known by one ordinarily skilled in the art, the invention is equally applicable to content addressable memories that include many valid bits and subsequent data cell arrays that have a different number of data bits per word, array or sub-array. Only in the event of a match on the first two arrays 20, 22, does the sense amplifier 24 activate the search on the third CAM cell array 26.

Figure 3:
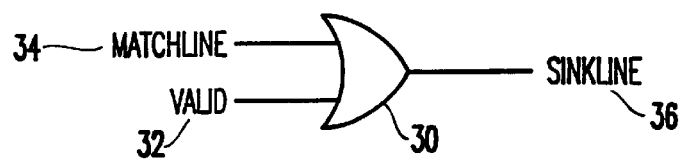
FIG. 3 is a schematic block diagram of a comparator used with the invention.

FIG. 3 illustrates the comparator 30 that performs an OR operation of the matchline 34 and the valid signal 32. With respect to the first and second sub-arrays to be tested, the matchline 34, the valid signal 32 and the sinkline 36 are all active low. As mentioned above, only when the matchline 34 is low indicating that the data in the second CAM cell array 22 matches, and the valid signal 32 is low indicating that the data within the array is valid, will the sinkline 36 drop to a low voltage level to indicate the match in the first two sub-arrays 20, 22. When the search data mismatches the stored data in the third sub-array 26, the matchline 14 in FIG. 1 discharges through the compare transistors 12 into the sinkline 16. Since the voltage of both the sinkline 16 and matchline 14 are equal, this indicates a mismatch. If the search data matches the stored data in the third sub-array 26, the compare transistors 12 do not provide a path from the matchline 14 to the sinkline 16 and so their voltages remain different to indicate a match.

Figure 4:
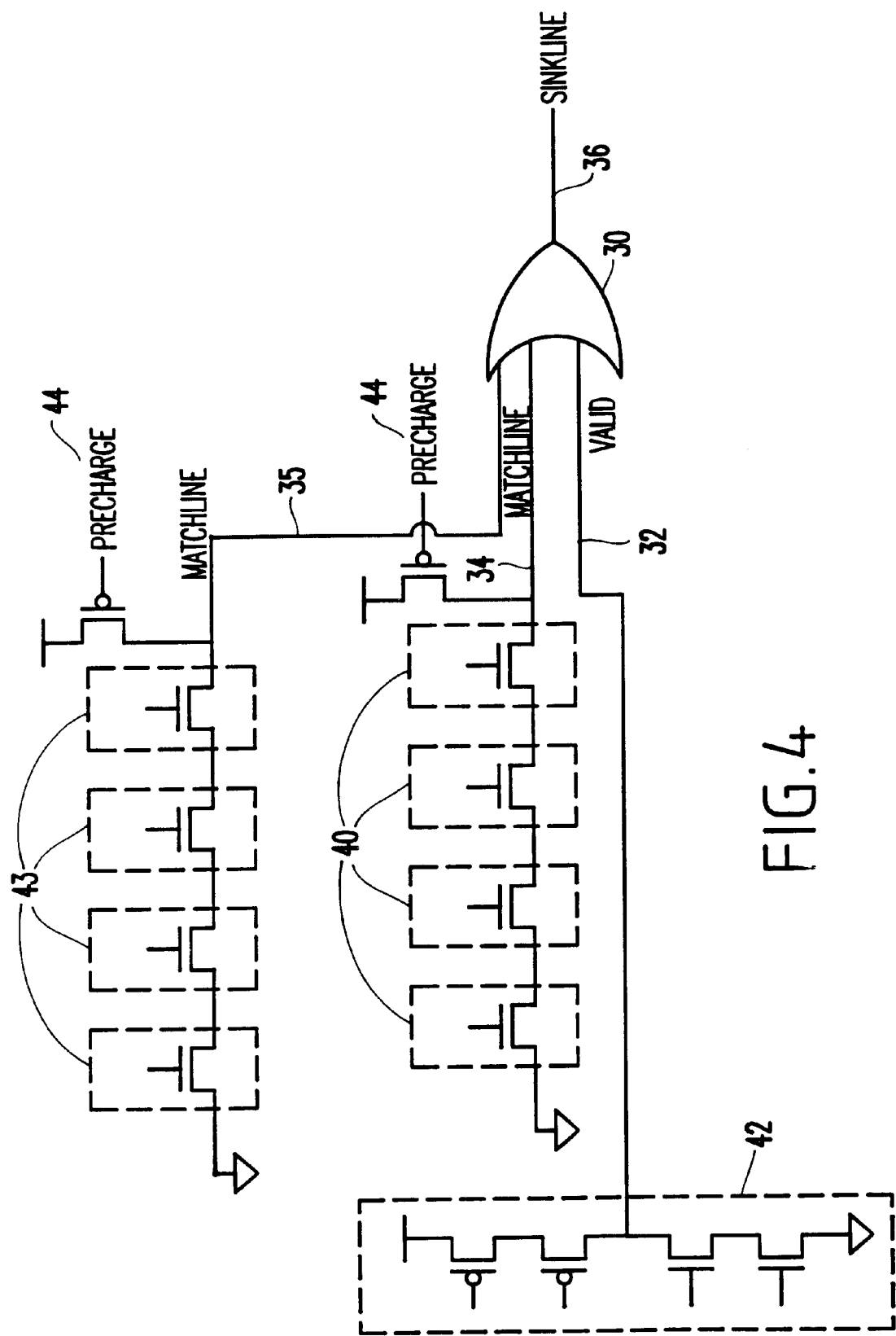
FIG. 4 is a partial schematic diagram of a memory array according to one embodiment of the invention.
Figure 5:
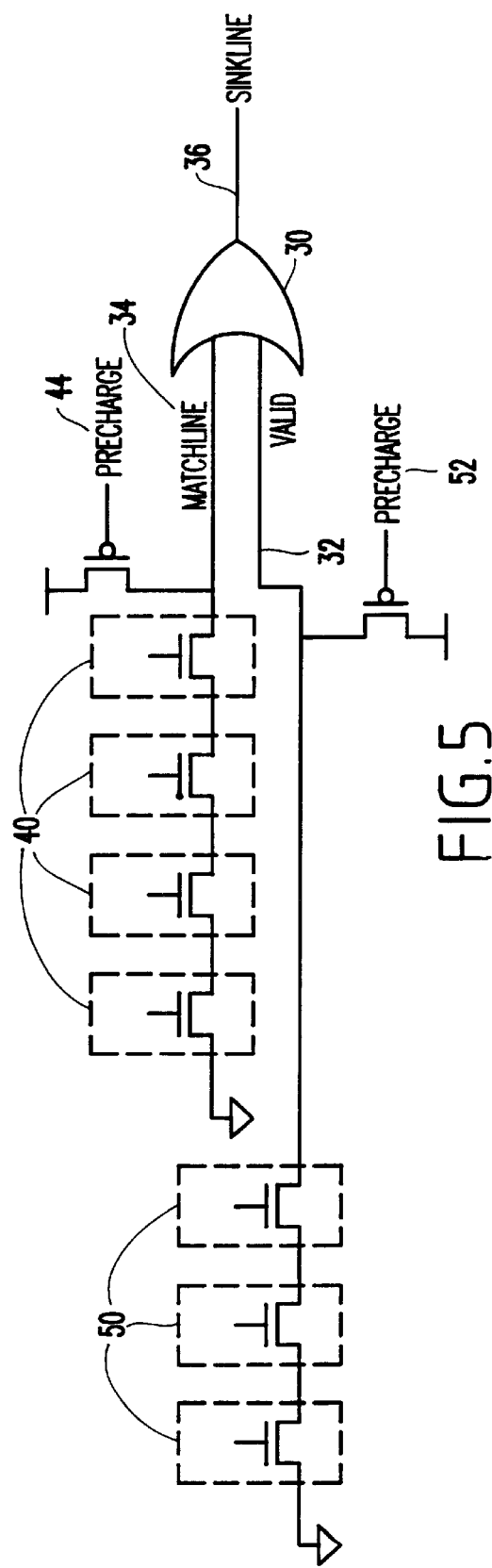
FIG. 5 is a partial schematic diagram of a memory array according to one embodiment of the invention.

Additional sub-arrays can be compared in parallel as FIGS. 4 and 5 depict. Additional sub-arrays would be added by increasing the number of inputs on the OR logic gate. It is preferable that the majority of the bits would be in the last sub-array, so that the most power would be saved.

The comparator in FIG. 3, which represents the first sense amplifier 24, is shown in sub-arrays in FIGS. 4 and 5. More specifically, FIG. 4 illustrates parallel sets of four cells 40, 43 of the second CAM cell array 22 and a single valid cell 42 (first CAM cell array 20). The precharge devices 44 are also illustrated in FIG. 4. FIG. 5 is similar to FIG. 4 except the first CAM cell array 20 is shown having three bits 50, in addition a precharge device 52 for the valid signal 32 is illustrated. As discussed above, the comparator 30 only produces a low voltage sinkline 36 when the matchlines 34, 35 indicate matching data and the valid signal 32 indicates that the data within the array is valid. Using a static gate within comparator 30 provides decreased power consumption by decreasing the capacitive load on the clock signal. Additionally, using a static gate to maintain the sinkline 36 at either a high or a low signal provides noise immunity advantages over the existing schemes which precharge the sinkline 36 high and conditionally drive it low. Those schemes leave the sinkline 36 floating high during a compare, making it susceptible to noise, which could signal a false result. By contrast, with the invention, the sinkline is not a dynamic signal but rather a static one and does not have the aforementioned problems.

Figure 7:
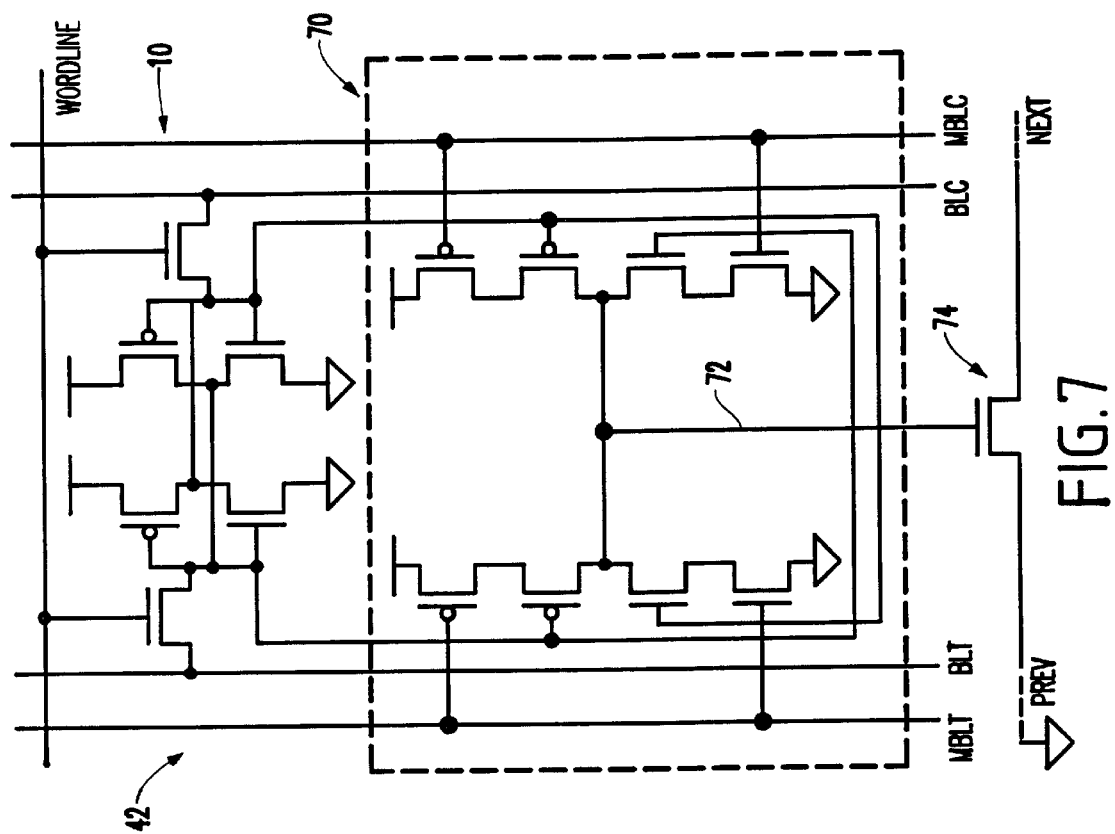
FIG. 7 is a schematic diagram of a memory cell according to the invention.
Figure 6:
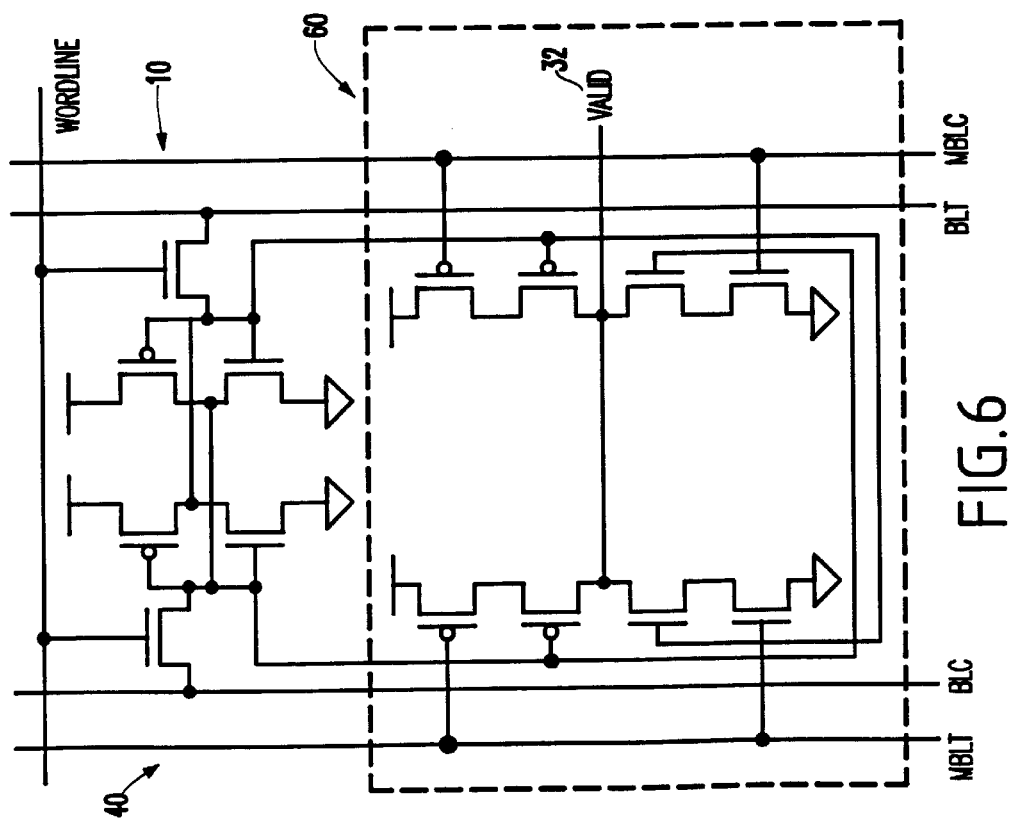
FIG. 6 is a schematic diagram of a valid bit memory cell according to the invention.

FIG. 6 illustrates a fully static CAM cell 42 in greater detail and FIG. 7 illustrates one of the partially dynamic storage bits 40 (or 50) in greater detail. These cells are somewhat similar to the cells shown in FIG. 1 and include a storage region 10 and a comparator 60. However, the comparator 60 in FIG. 6 includes a valid signal line 32 that is output to the comparator 30, as discussed above.

FIG. 7 is also similar to the structure shown in FIG. 1. However, the comparator 70 includes a comparison output line 72 that controls a transistor 74 (NFET). As shown in FIGS. 4 and 5, the cells 40 are serially connected. The transistor 74 connects the previous cell with the next cell. This signal is eventually output to the first sense amplifier 24.

Figure 8:
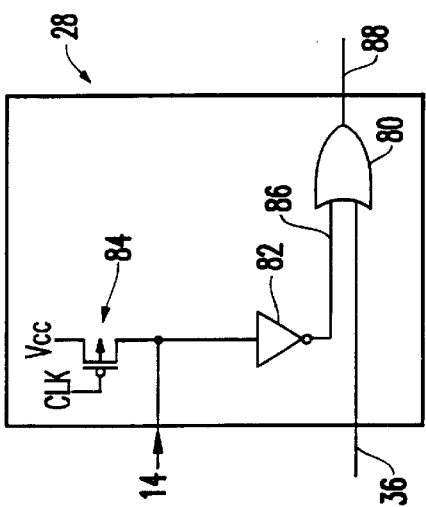
FIG. 8 is a schematic diagram of a sense amplifier.

FIG. 8 illustrates a partial schematic diagram of the sense amplifier 28. Initially, the sense amplifier 28 receives the matchline 14 and the sinkline 36 from the last sequential CAM cell shown in FIG. 1. The matchline 14 is input to an inverter 82 that is also supplied with a voltage signal (Vcc) through a transistor 84. The transistor 84 is controlled by a clock signal CLK in order to precharge the matchline 14 between searches. Then, the inverter 82 outputs a signal 86 to an OR gate 80 which combines with the sinkline signal 36 and sends its output 88 to be interpreted as an active low match address, typically interpreted next by a priority encoder (which is well known in those trained in the art).

The cells 40 are held in the mismatch condition between cycles (both match bitlines, (MBLC and MBLT) are held high) to keep transistor 74 off and permit precharge 44 to keep matchline 34 high.

Figure 9:
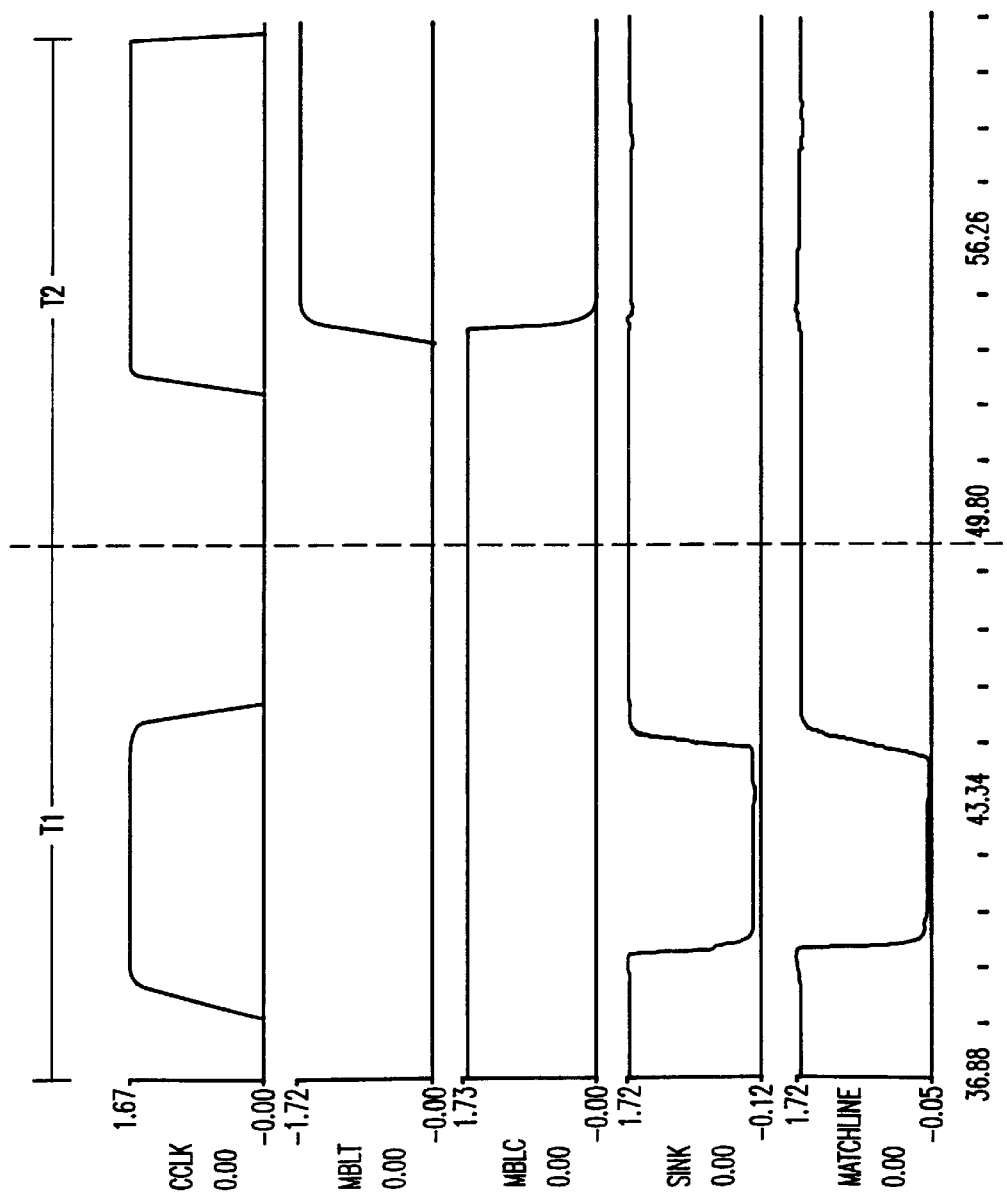
FIG. 9 is a timing diagram showing the states of the signals as they operate with the inventive structure.

FIG. 9 illustrates two exemplary operations (T1 and T2) of the signal waveforms of the sinkline and matchline. For the first rise of the CCLK (e.g., T1), the data results in a match in the first two sub-arrays (20, 22), so the sinkline falls and enables the compare for the third sub-arrays 26. The third sub-arrays 26 mismatches and discharges the matchline into the sinkline.

In the second rise of the CCLK (e.g., T2), there is a mismatch in the first two sub-arrays of the data, so the sinkline and matchline stay high, disabling the match for the third sub-array. Even though the third sub-array may mismatch, since the sinkline stays high, the matchline cannot be discharged, thus resulting in power savings when the sinkline and matchline do not need to be precharged before the next compare operation.

Figure 10:
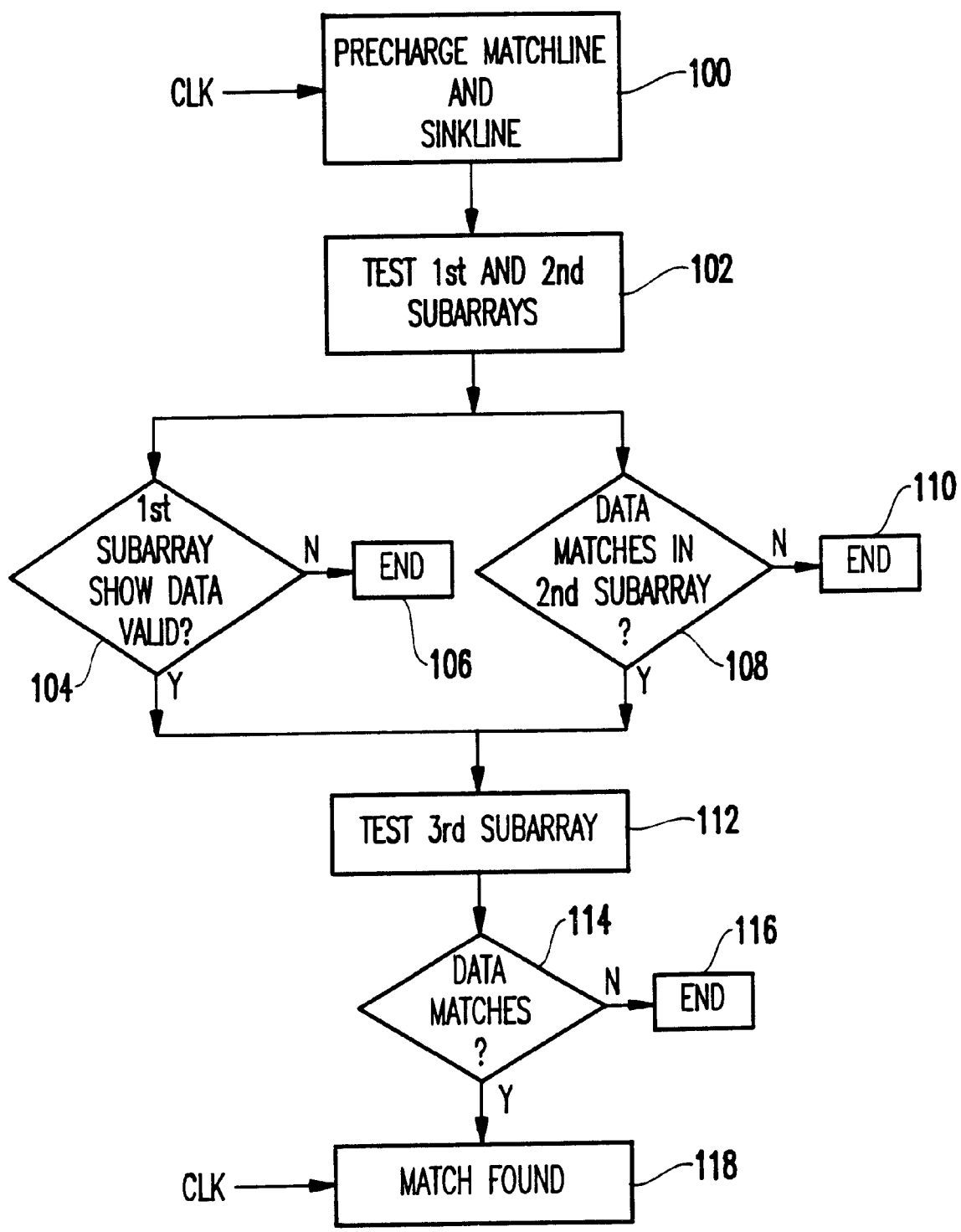
FIG. 10 is a flowchart showing the invention.

The second sense amplifier 28 signals a match if and only if the sinkline is low and the matchline is high. If both the matchline and sinkline are high, there is a mismatch in at least one of the first two sub-arrays, and if both the matchline and the sinkline are low, the third subset is mismatched. There is not a case where the matchline is low and the sinkline is high. The invention is shown in a flowchart form in FIGS. 10 and 11. Referring to FIG. 10, in item 100, the invention precharges the matchline 14 and the sinkline 16. Then, in item 102, the invention tests the first and second arrays 20, 22 with the comparison data. If the comparison data mismatches the first array 20 (104), then the invention discontinues any additional comparison processes, as indicated by item 106. Similarly, if the comparison data does not match the data contained within the second array 22 (108), no additional comparison processes are performed (110) and neither the matchline 14 nor the sinkline 16 are discharged.

To the contrary, if the comparison data matches both the valid data 20 and the first sub-array 22 in items 104 and 108, the sinkline 16 discharges and the subsequent sub-array 26 is tested 112. More specifically, the comparison data is compared to the data contained within the third array 26 to determine whether a match exists (114). If the data does not match, the process ends in item 116 indicating a mismatch. Otherwise, the invention indicates that a match is found in item 118.

Figure 11:
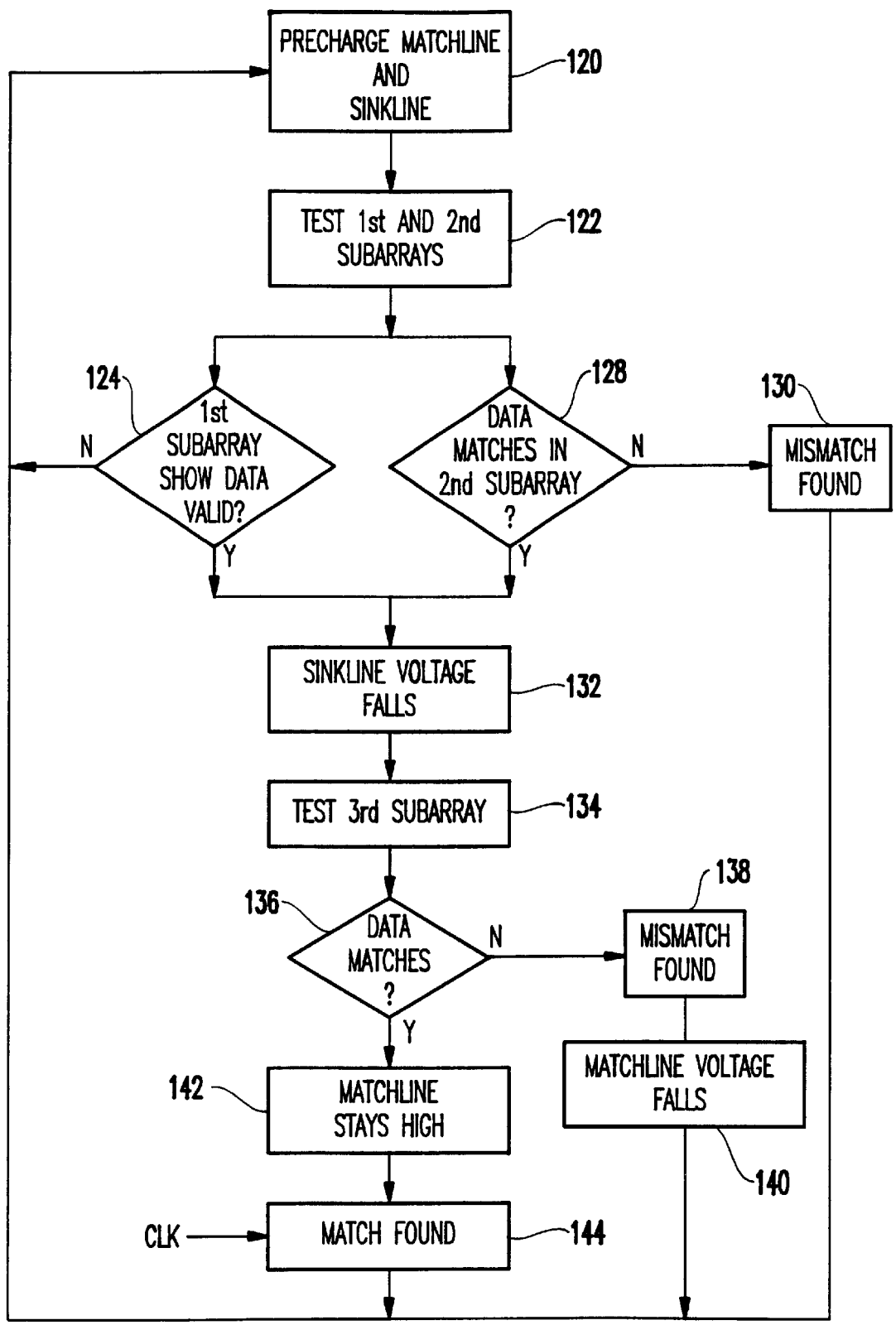
FIG. 11 is a flowchart showing the invention.

FIG. 11 illustrates a similar but more detailed flowchart where the matchline 14 and the sinkline 16 are precharged in item 120. In a similar manner to FIG. 10, the first and second sub-arrays 20, 22 are tested in item 122. If the comparison data is not determined to be valid with the data in the first sub-array 20 (124), the process returns to item 120 and the sinkline 16 voltage remains at the precharged state. Similarly, if the comparison data does not match the data within the second array 22 (128), the sinkline 16 voltage remains high indicating that a mismatch has been found (130).

To the contrary, if the comparison data is valid (124) and matches the second sub-array (128), then, in item 132, the sinkline 16 voltage falls. A fall in the sinkline 16 voltage allows the third sub-array 26 to be tested in item 134. If the comparison data matches the data in the third sub array 26 (136), the matchline 14 remains at the precharged high voltage, as shown in item 142. The low sinkline 16 voltage and the high matchline 14 voltage indicates that a match has been found in item 144. To the contrary, if the comparison data does not match the data contained within the third sub-array 26, a mismatch condition 138 occurs and the matchline 14 voltage falls in item 140. Therefore, as shown above, the instances in which the matchline 14 and sinkline 16 will discharge is substantially reduced when compared to conventional systems. This power savings is substantial when compared to the circuit as a whole.

As mentioned above, for the vast majority of the time, input data does not match the data stored within the sub-arrays. For example, if 4 bits were in the second array, assuming that the second array is filled with random data, and a search is conducted with random data, the chance of a match is $(\frac{1}{2})^4$, or $\frac{1}{16} = 6.25\%$. Therefore, with the invention, the matchline 34 would need to be precharged only 6.25% of the time. This means that the invention would only need to waste power on a full search 6.25% of the time. All things being equal, this modified array would consume $\frac{1}{16}$ the power of a conventional array; however, the additional power of adding a sinkline doubles the power consumed in a search on the third array, so average data would show a $1-\frac{1}{8}$ $(1-0.126)=87.5\%$ average theoretical power savings over conventional matchline structures.

By using a sinkline based architecture, there is an inherent power savings because of the invention's architecture. Without a sinkline, the match bitlines must be precharged to prevent a compare operation during the precharge event on the matchline. With a sinkline driven high during the matchline precharge event, the match bitlines are rendered irrelevant. Using statistically random data, there is a 50% probability that the match bitlines will contain the same data for two consecutive operations. Therefore, the match bitline structure (data drivers and the compare FETs) will end up saving 50% of the match bitline power because they would not need to switch in that case. This can be seen in FIG. 1 wherein if the sinkline 16 and matchline 14 are both at a high voltage, turning the compare transistors on and off (as the prior art does in precharging) has no effect. Only when the sinkline voltage drops will the match bitlines trigger a compare. This assures the designer that this timing restraint is met.

As shown above, the invention reduces the number of times the matchline must be precharged by reducing the situations in which the matchline may discharge. The valid cell 20 and sinkline 36 prevent the matchline 34 from discharging unless specific circumstances occur. Matchline power consumption goes up as the number of bits in a word increase. Match bitline power consumption goes up as the number of words in the array goes up. Therefore, the invention can produce even greater power savings as the sizes of the arrays and sizes of the words increase. Power is also saved by only comparing data words that have been marked as "valid" within the scope of the application. In the event that a word is marked invalid, only the first two sub-arrays compare, leaving the presumably largest subset of the data to save power.

While the invention has been described in terms of preferred embodiments, those skilled in the art will recognize that the invention can be practiced with modification within the spirit and scope of the appended claims.

What is claimed is:

1. A content addressable memory array comprising:
   a plurality of memory sub-arrays;
   a matchline connected to each of said sub-arrays;
   a sinkline connected to each of said sub-arrays; and
   a said sinkline and said matchline adapted to be initially set to a second voltage from a first voltage and to be reset to said first voltage, each depending on results of comparing said input data with data contained within said sub-arrays;
   wherein said second voltage appearing on said matchline and said first voltage appearing on said sinkline indicates a match between data within all of said sub-arrays and said input data, and said second voltage appearing on said sinkline indicates a mismatch between data within any of said sub-arrays and said input data.

2. The array in claim 1, wherein within each of said sub-arrays, said memory cells are connected serially.

3. The array in claim 2, wherein each of said memory cells includes a dynamic transistor for communicating with adjacent memory cells.

4. The array in claim 1, further comprising a plurality of sense amplifiers, each connected to a different sub-array, wherein said sense amplifiers include a single inverter.

5. The array in claim 1, wherein said first of said sub-arrays having data matching said input data drops sinkline to said first voltage.

6. The array in claim 5, wherein if said sinkline is at said first voltage and a second of said sub-arrays has data different than said input data, said sinkline is connected to said matchline to drop said matchline to said first voltage.

7. The array in claim 5, wherein if said sinkline is at said first voltage and a second of said sub-arrays has data matching said input data, said matchline maintains said second voltage.

8. A content addressable memory array comprising:
   a plurality of memory sub-arrays, each of said sub-arrays including at least one memory cell;
   a matchline connected to each of said sub-arrays;
   a sinkline connected to each of said sub-arrays; and
   said sinkline and said matchline adapted to be set to a second voltage from a first voltage, said second voltage having a higher absolute value than said first voltage,
   wherein said second voltage appearing on said matchline and said first voltage appearing on said sinkline indicates a match between data within all of said sub-arrays and input data, and said second voltage appearing on said sinkline indicates a mismatch between data within any of said sub-arrays and said input data, wherein an invalid status within said valid memory cell maintains said sinkline at said second voltage, wherein a first of said sub-arrays having data different than said input data maintains said sinkline at said second voltage, and wherein said sinkline maintains said matchline at said second voltage while said sinkline is at said second voltage.

9. The array in claim 8, wherein within each of said sub-arrays, said memory cells are connected serially.

10. The array in claim 9, wherein each of said memory cells includes a dynamic transistor for communicating with adjacent memory cells.

11. The array in claim 8, further comprising a plurality of sense amplifiers, each connected to a different sub-array, wherein said sense amplifiers include a single inverter.

12. The array in claim 8, wherein said first of said sub-arrays having data matching said input data drops said sinkline to said first voltage.

13. The array in claim 12, wherein if said sinkline is at said first voltage and a second of said sub-arrays has data different than said input data, said sinkline is connected to said matchline to drop said matchline to said first voltage.

14. The array in claim 12, wherein if said sinkline is at said first voltage and a second of said sub-arrays has data matching said input data, said matchline maintains said second voltage.

15. A content addressable memory array comprising:

a plurality of memory sub-arrays, each of said sub-arrays including at least one memory cell;

a matchline connected to each of said sub-arrays;

a comparator having a first input connected to said matchline;

a valid memory cell connected to a second input of said comparator;

a sinkline output from said comparator; and said sinkline and said matchline adapted to be set to a second voltage from a first voltage;

wherein said second voltage appearing on said matchline and said first voltage appearing on said sinkline indicates a match between data within all of said sub-arrays and input data, and said second voltage appearing on said sinkline indicates a mismatch between data within any of said sub-arrays and said input data.

16. The array in claim 15, wherein an invalid status within said valid memory cell maintains said sinkline at said second voltage, wherein a first of said sub-arrays having data different than said input data maintains said sinkline at said second voltage, and wherein said sinkline maintains said matchline at said second voltage while said sinkline is at said second voltage.

17. The array in claim 15, wherein within each of said sub-arrays, said memory cells are connected serially.

18. The array in claim 17, wherein each of said memory cells includes a dynamic transistor for communicating with adjacent memory cells.

19. The array in claim 15, further comprising a plurality of sense amplifiers, each connected to a different sub-array, wherein said sense amplifiers include a single inverter.

20. The array in claim 15, wherein said first of said sub-arrays having data matching said input data drops said sinkline to said first voltage.

21. The array in claim 20, wherein if said sinkline is at said first voltage and a second of said sub-arrays has data different than said input data, said sinkline is connected to said matchline to drop said matchline to said first voltage.

22. The array in claim 20, wherein if said sinkline is at said first voltage and a second of said sub-arrays has data matching said input data, said matchline maintains said second voltage.

23. A content addressable memory array comprising:

a plurality of memory sub-arrays;

a matchline connected to each of said sub-arrays; and a sinkline connected to each of said sub-arrays, wherein said sinkline and said matchline are adapted to be initially set to a second voltage from a first voltage and to be reset to said first voltage, each depending on results of comparing input data with data contained within said sub-arrays, wherein said second voltage has a higher absolute value than said first voltage, and wherein said matchline is prevented from discharging from said second voltage to said first voltage if said first voltage appears on said sinkline and one of said sub-arrays has data matching said input data.

24. A content addressable memory array comprising:

a plurality of memory sub-arrays;

a matchline connected to each of said sub-arrays; and a sinkline connected to each of said sub-arrays, wherein said sinkline and said matchline are adapted to be initially set to a second voltage from a first voltage and to be reset to said first voltage, each depending on results of comparing input data with data contained within said sub-arrays, wherein said second voltage has a higher absolute value than said first voltage, wherein a first of said sub-arrays having data different than said input data maintains said sinkline at said second voltage, and wherein said matchline is prevented from discharging from said second voltage to said first voltage while said sinkline is at said second voltage.

* * * * *